United States Patent [19]
Pehlke et al.

[11] Patent Number: 5,994,985
[45] Date of Patent: Nov. 30, 1999

[54] INTEGRABLE HIGH-Q TUNABLE CAPACITOR AND METHOD

[75] Inventors: David R. Pehlke, Thousand Oaks; Amit Burstein, Encino; Mau Chung F. Chang, Thousand Oaks, all of Calif.

[73] Assignee: Rockwell Science Center, LLC, Thousand Oaks, Calif.

[21] Appl. No.: 08/985,564

[22] Filed: Dec. 5, 1997

[51] Int. Cl.$^6$ ........................................ H03J 3/20
[52] U.S. Cl. ........................ 334/14; 333/180; 334/61; 336/155; 336/200
[58] Field of Search ........................ 331/36 R, 181; 333/174, 177–180; 334/11, 12, 14, 61–63, 71; 336/155, 181; 361/281

[56] References Cited

U.S. PATENT DOCUMENTS

| | | | |
|---|---|---|---|
| 2,735,989 | 2/1956 | Williams | 336/155 |
| 3,541,455 | 11/1970 | Katayama | 334/12 X |
| 5,163,173 | 11/1992 | Casagrande | 336/155 X |

FOREIGN PATENT DOCUMENTS

| | | | |
|---|---|---|---|
| 9720388 | 5/1997 | WIPO | H03H 11/08 |

*Primary Examiner*—Paul Gensler
*Attorney, Agent, or Firm*—Koppel & Jacobs

[57] ABSTRACT

A high-performance integrable tunable inductor includes a "primary" coil and a "drive" coil placed in close proximity to each other and simultaneously driven with primary and drive currents, respectively. The drive current induces mutual components of inductance in the primary coil which vary with the phase and amplitude relationship between the two currents. These relationships are controlled to precisely establish the impedance of the primary coil, allowing the inductor to be "tuned" to provide a desired inductance or resistance by simply varying the phase and amplitude relationships appropriately. Inductance values tunable over ranges of about 2:1 and Q values of nearly 2000 have been demonstrated. The primary coil can also be made to operate as a relatively large integrated capacitance by setting the phase and amplitude relationships appropriately. The tunable inductor can be fabricated with standard CMOS processes, or any of a number of other processing technologies, and thus integrated into a host of analog circuits for which a highly-integrated implementation is desirable.

11 Claims, 10 Drawing Sheets

Phase-Shift

INTEGRABLE HIGH-Q TUNABLE CAPACITOR AND METHOD

BACKGROUND OF THE INVENTION

1. Field of the Invention

This invention relates to the field of precision inductors, particularly tunable inductors that can be integrated.

2. Description of the Related Art

Demands for more efficient, higher performance, smaller electronic circuits are regularly heard. Integration typically results in smaller circuits, but often at the expense of performance. In the area of wireless communications, for example, highly integrated transceiver designs often require high performance passive components—particularly inductors and capacitors—but present integrated versions of these components typically possess several performance-degrading shortcomings.

It is often desirable for the inductors in an RF transceiver to have low loss and high quality factor (Q) characteristics: high-Q tank circuits in voltage-controlled oscillators (VCOs) reduce phase noise, low loss inductors in low noise amplifiers (LNAs) and power amplifiers improve input and output matching, and inductively loaded circuits in general offer significant power savings when implemented with high-Q components. These demands are not easily met, however, when the passive components are integrated. For example, the frequency selectivity of a circuit in which an inductor is used increases with its Q, requiring extremely precise values of inductance which are difficult to attain in an integrated device. Deviations from the desired inductance value must be compensated for with other frequency-variable passive elements, which may be limited in both Q and tuning range.

The performance of integrated inductors is also limited by the parasitic capacitance inherently present between coil and substrate. This capacitance resonates with the inductance at the self-resonant frequency, which often serves as a frequency limit below which circuits must operate. Larger coils are needed to obtain larger values of inductance, but the coil's larger area results in higher values of capacitance and a lower self-resonant frequency. Larger coils also possess a higher series resistance, increasing losses and reducing Q.

At present, these shortcomings are best addressed with fixed value off-chip inductors, but variations in component value, assembly technology, die interconnection methods, and packaging variations can cause changes in the inductance seen by the design. Using off-chip components also increases assembly time and reduces reliability. Also, the power dissipation of buffers which drive off-chip signals can be significant, resulting in higher power consumption.

"Active" inductor circuits, based on transistor gain stages and gyrator configurations, for example, have also been used to achieve integrated inductances. These circuits typically involve the use of active devices in a feedback loop, which gives rise to a number of problems: the active devices can generate unacceptably high levels of noise, they can saturate—limiting their dynamic range, and they consume amounts of power that may be undesirable in low power systems.

SUMMARY OF THE INVENTION

A high-performance integrable inductor is presented which overcomes the problems noted above, offering Q values nearly 2000 or more and an impedance whose resistive and reactive components can be precisely fixed values or readily tunable.

A "primary" coil and a "drive" coil are placed in close proximity to each other and simultaneously driven with a primary current and a drive current, respectively, both of which are alternating (i.e., non-DC) currents. Each current has a particular frequency and amplitude, with their respective frequencies preferably equal. The drive current induces mutual components of inductance in the primary coil which vary with the phase and amplitude relationship between the two currents. The phase and amplitude relationships are controlled to precisely establish the primary coil's impedance, and thus achieve desired values of inductance and/or resistance.

A drive current is generated with a fixed phase and amplitude relationship to the primary current to provide a desired fixed impedance value in the primary coil. However, by simply varying the phase and/or amplitude relationships between the two currents, the inductor is "tuned" to provide a desired impedance and a desired inductance or resistance thus achieved. This tuning capability is critical for frequency selective applications, because of the extremely high-Q values attainable with the invention.

The tunable inductor is particularly well-suited to overcoming resistive losses commonly found in conventional integrated inductors. When the phase and amplitude relationships between primary and drive current are manipulated appropriately, primary coil resistance values near zero or less are achievable, compensating for resistive losses inherent in the primary coil. This technique has resulted in the measurement of Q values of nearly 2000, with even higher values theoretically possible. The high-Q characteristic of this integrable inductor facilitates extremely low-power high-performance RF integrated circuits that have heretofore been impossible to achieve.

A tunable inductor system preferably includes phase shifter and attenuator circuits to generate the drive current based on the primary current. The primary current is generally a signal which must be run through an inductor, such as an input to a transceiver's LNA or an output from its power amplifier. Inductance and resistance values tunable over ranges of about 2:1 and about 67:1, respectively, have been demonstrated.

The present invention can also be employed as a fixed or tunable capacitor. By setting phase and amplitude relationships appropriately, the primary coil is made to have a negative reactive impedance; i.e., a capacitance. The techniques described herein enable a relatively large and precisely fixed capacitance to be achieved with an integrated component.

The novel inductor structure can be fabricated with a standard 0.5 $\mu$m CMOS process, or any of a number of other processing technologies, and thus integrated into a host of analog circuits for which a highly-integrated implementation is desirable. The unprecedented ability to integrate tunable inductors as part of RF integrated circuits finds application in a myriad of high-performance analog circuits.

Further features and advantages of the invention will be apparent to those skilled in the art from the following detailed description, taken together with the accompanying drawings.

BRIEF DESCRIPTION OF THE DRAWINGS

FIG. 2b is an equivalent schematic diagram for the inductor of FIG. 2a.

FIG. 2c is a cross-sectional view of the inductor in FIG. 1a, cut along section line 2c—2c in FIG. 2a.

FIG. 10b is a schematic diagram of the integrated circuit of FIG. 10a.

DETAILED DESCRIPTION OF THE INVENTION

Figure 1:
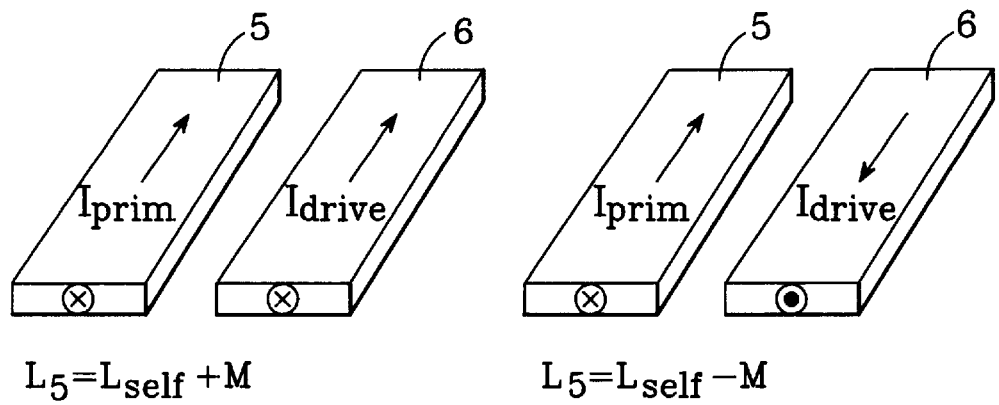
FIG. 1 illustrates the operating principle of a tunable inductor per the present invention.

The operating principle behind the operation of a tunable inductor per the present invention is illustrated in FIG. 1. A first length of conductor 5 has a current $I_{prim}$ flowing through it, and a second conductor 6 has a current $I_{drive}$ flowing through it. When parallel currents travel in the same direction, each conductor induces positive mutual components of inductance M in the other conductor. Parallel currents traveling in opposite directions induce negative mutual inductance components. When the two currents are completely coherent, i.e., $I_{prim}$ and $I_{drive}$ are in-phase and traveling in the same direction, the inductance $L_5$ of conductor 5 is given by:

$$L_5 = L_{self} + M,$$

where $L_{self}$ is the self-inductance of conductor 5. When the two currents are in-phase and traveling in opposite directions, $L_5$ is given by:

$$L_5 = L_{self} - M.$$

The mutual component M may be continuously increased or decreased based on the relative phases of the coupled currents, providing a tunable reactance in conductor 5. A desired inductance or capacitance value can thus be achieved in conductor 5 by establishing the appropriate phase relationship between the currents.

Figure 2A:
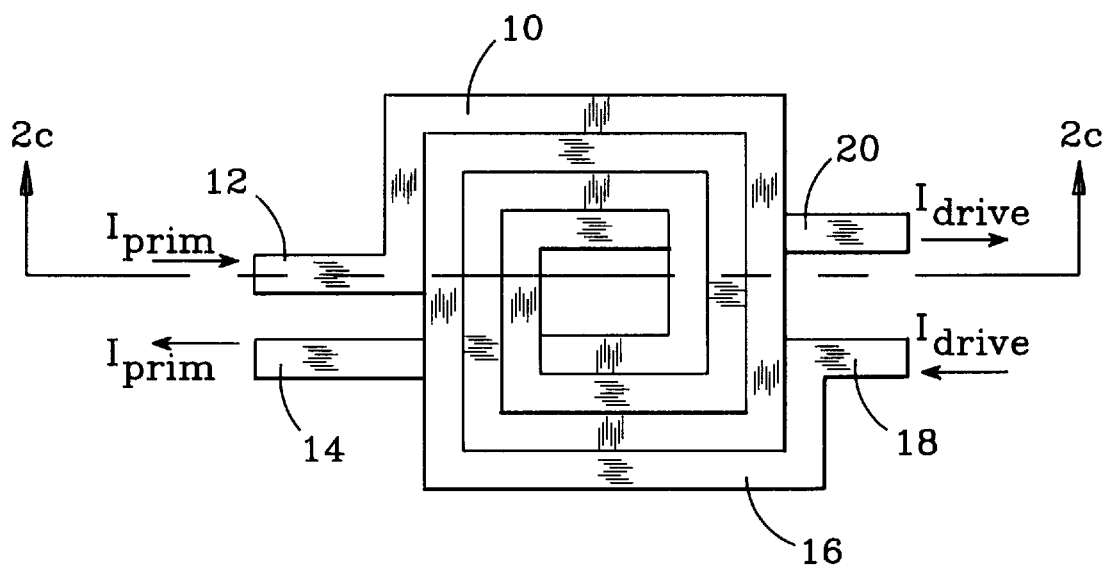
FIG. 2a is a top plan view of a tunable inductor per the present invention.

One implementation of a tunable inductor is shown in FIGS. 2a (plan view) and 2c (corresponding cross-section). A primary coil 10 has two terminals 12 and 14, and primary current $I_{prim}$ flows through the primary coil between the terminals. A drive coil 16 has terminals 18 and 20, and drive current $I_{drive}$ flows through the drive coil between the terminals. Both coils are driven by their respective currents simultaneously. Both primary and drive currents must be alternating currents in order for the tunable inductor to present a tunable reactance to an incoming signal.

Figure 2B:
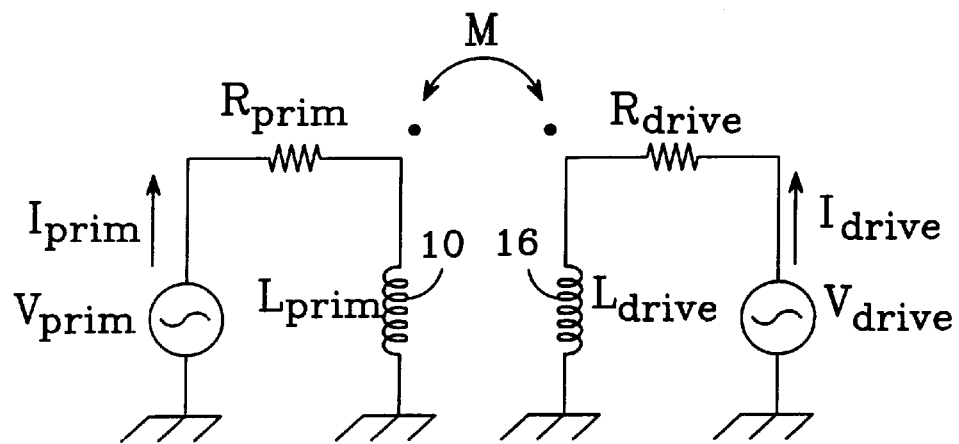

An equivalent schematic diagram for the inductor in FIG. 2a is shown in FIG. 2b. A voltage $V_{prim}$ generates the current $I_{prim}$ through primary coil 10; $I_{prim}$ also flows through a series resistance $R_{prim}$ inherent in primary coil 10. A voltage $V_{drive}$ generates the current $I_{drive}$ through drive coil 16, as well as through its series resistance $R_{drive}$. Coil 10 has an inductance $L_{prim}$ and coil 16 has an inductance $L_{drive}$, each of which is comprised of its own self-inductance and the mutual inductance components of its own coils, one turn to another. Primary coil 10 and drive coil 16 are placed in close proximity so that mutual components of inductance M are induced in them by the two currents. The voltage $V_{prim}$ is given by:

$$V_{prim} = I_{prim} \times (R_{prim} + j\omega L_{prim}) + j\omega M A I_{drive} \quad \text{(Eq. 1)}$$

and $V_{drive}$ is given by:

$$V_{drive} = I_{drive} \times (R_{drive} + j\omega L_{drive}) + j\omega M A I_{prim} \quad \text{(Eq. 2)}$$

A is a factor based on the ratio of the amplitudes of the primary and drive currents.

When the frequencies of the two currents are equal, $I_{drive}$ can be given by:

$$I_{drive} = A I_{prim} e^{j\phi} \quad \text{(Eq. 3)}$$

with $\phi$ being the phase angle between the currents. As defined herein, $\phi$ represents the angle by which $I_{prim}$ leads $I_{drive}$. Thus, when the frequencies of the two currents are equal, the impedance seen at the terminals of the primary coil 10 can be given by:

$$Z_{prim} = V_{prim}/I_{prim} = R_{prim} + j\omega L_{prim} + j\omega A M e^{j\phi} \quad \text{(Eq. 4)}$$

As can be seen from Eq. 4, the impedance of the primary coil is related to the values of $\phi$ and A, and it is by manipulating these factors that the inductor is tuned. The inductance seen at the primary coil terminals $L_{tot}$ is as follows:

$$L_{tot} = (Im[V_{prim}/I_{prim}])/\omega = (\omega L_{prim} + \omega A M \cos\phi)/\omega \quad \text{(Eq. 5)}$$
$$= L_{prim} + A M \cos\phi$$

$L_{prim}$ is a fixed value based on the physical configuration of the primary coil. It is the AM cos $\phi$ term that makes the inductor tunable, with the inductance seen at the terminals of the primary coil directly related to the phase angle $\phi$ and the amplitude ratio A between the primary and drive currents. A desired inductance is precisely obtained by generating a drive current $I_{drive}$ having the necessary phase and amplitude relationships to the primary current.

The resistance seen at the primary coil terminals $R_{tot}$ is as follows:

$$R_{tot}=Re[V_{prim}/I_{prim}]=R_{prim}-AM\sin\phi \qquad \text{(Eq. 6)}$$

$R_{prim}$ is a fixed value based on the physical configuration of the primary coil, but as can be seen by Eq. 6, the AM sin $\phi$ term can be manipulated so that the inherent resistance $R_{prim}$ can be compensated, and an $R_{tot}$ produced that is nearly zero or even less than zero. It is this feature of the invention—providing a mechanism for compensating for the primary coil's inherent series resistance—that enables the attainment of extremely high-Q values. $R_{tot}$ can be varied between a maximum value of $R_{prim}+AM$ (at $\phi=0$ or $\pi$) to a minimum value of $R_{prim}-AM$ (at $\phi=\pi/2$).

The frequencies of the primary current $I_{prim}$ and the drive current $I_{drive}$ are preferably equal—if they are not, the $L_{prim}$ that results will vary with the instantaneous difference frequency between the two currents.

Though the coils in FIG. 2a are shown as square-spirals, the invention is not limited to any particular coil geometry. "Coil", as used herein, simply refers to a length of conductor—a spiral shape is not essential. The invention is effective as long as the current through the inductor's drive coil induces a mutual inductance component in its primary coil. The amplitude of the mutual inductance component depends on a number of variables, including the geometry of the coils, their spatial separation, and the relationships between the primary and drive currents.

The sign of the M term in Eq. 5 can be positive or negative, depending on the direction of current flow through the drive coil. Drive current flowing in the same direction as the primary current produces a positive M, increasing the inductance of the primary coil, and drive current in the opposite direction reduces $L_{tot}$.

Because drive coil 16 can be used to boost the inductance of the primary coil 10, a desired inductance value can be obtained with a smaller coil than would be necessary with a conventional one-coil inductor. This provides several benefits: a smaller coil has less series resistance than does a larger coil, improving Q, and will also have a smaller parasitic capacitance. A smaller capacitance results in a higher self-resonant frequency, increasing the frequency range over which a circuit employing the inductor can be used.

Figure 3:
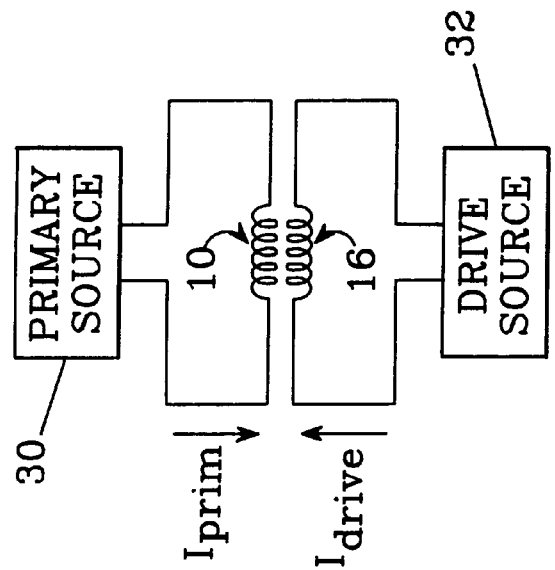
FIG. 3 is a block diagram of a basic tunable inductor system per the present invention.

The invention requires that both primary and drive coils be driven simultaneously. Circuits for supplying these currents are shown in FIG. 3. A circuit 30 is the source of the primary current $I_{prim}$, which is typically an RF signal; the inductance presented by primary coil 10 is used to, for example, form part of a reactive network. A circuit 32 is the source of the drive current $I_{drive}$, which is used to control the impedance seen by the primary current. The drive current and primary current may be generated independently, but typically the drive current is derived from the primary current, which insures that the frequencies of the two currents are equal.

Figure 4:
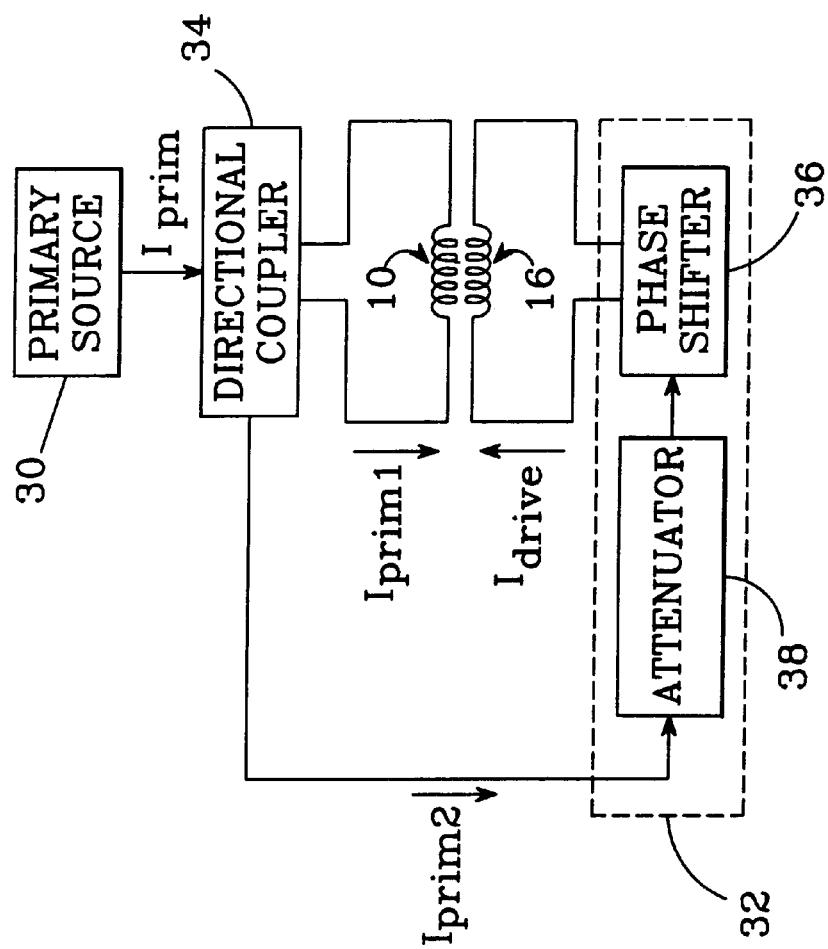
FIG. 4 is a block diagram of a tunable inductor system per the present invention.

As seen in Equations 5 and 6 above, the inductance and resistance seen at the primary coil's terminals are established by supplying a drive current to the drive coil which has particular phase and amplitude relationships to the primary current. This fact enables an inductor per the present invention to be tunable: by simply varying the phase and/or amplitude relationships between the two currents, the inductance and resistance of the primary coil can be changed. A system which establishes these relationships is shown in FIG. 4. Circuit 30 is the source of the primary current $I_{prim}$. $I_{drive}$ is then derived from $I_{prim}$ as follows: $I_{prim}$ is split into two signals—$I_{prim1}$ drives the primary coil 10 and $I_{prim2}$ is used for driving the drive coil 16. The splitting can be accomplished with, for example, a directional coupler 34. $I_{prim2}$ is fed to the circuit 32 that generates drive current $I_{drive}$, which preferably includes a phase shifter 36 and an attenuator 38. Attenuator 38 establishes a desired relationship between the amplitudes of $I_{prim1}$ and $I_{drive}$, and phase shifter 36 establishes a desired phase relationship between the two coil currents. Note that though both phase shifter and attenuator circuits are shown in FIG. 4, two separate circuits are not necessarily required: the phase shifter circuit itself is likely to attenuate the primary current to some degree, or alternatively, a desired attenuation factor could be designed into the phase shifter circuit. In some instances, it may be preferable that there be no attenuation at all. In fact, neither phase shifter 36 or attenuator 38 are absolutely essential to produce a useful inductor—the primary coil's inductance and resistance is likely to be altered from the its own inherent values even if $I_{prim2}$ drives the drive coil directly. However, in most instances a phase shifter and an attenuator will be required to produce a desired impedance in the primary coil.

The phase shifter 36 and attenuator 38 may be fixed or variable circuits. Fixed circuits provide fixed inductance and resistance values in the primary coil, which can be precisely set by simply adjusting the attenuator and phase shifter circuits upon assembly as necessary to obtain desired values, and then locking in those adjustments. An example implementation of fixed attenuator and phase shifter circuits is shown in the schematic diagram of FIG. 5a. Current $I_{prim2}$ is first fed to attenuator circuit 38 which comprises a voltage divider made from resistors R1 and R2. The resistors are selected to attenuate $I_{prim2}$ by a fixed amount. The attenuated signal is fed to the input 40 of phase shifter 36 which comprises a resistor R3 and a capacitor C1 connected in series between the phase shifter's input 40 and ground. An output $I_{drive}$ is taken from the node between R3 and C1, with the phase angle between $I_{drive}$ and $I_{prim2}$ determined by the values of R3 and C1. Note that the phase and amplitude relationships needed to obtain desired values of impedance are a strong function of the coil geometries. As such, an empirical determination of the phase shift and attenuation needed to obtain desired impedance values may be necessary.

Figure 5A:
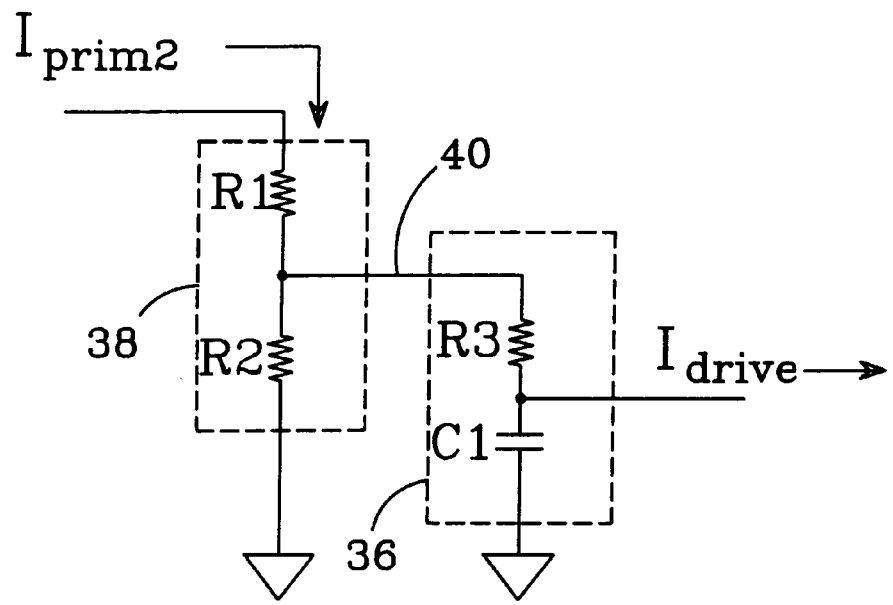
FIG. 5a is a schematic diagram of a fixed attenuator circuit and a fixed phase shifter circuit usable with a tunable inductor system per the present invention.
Figure 5B:
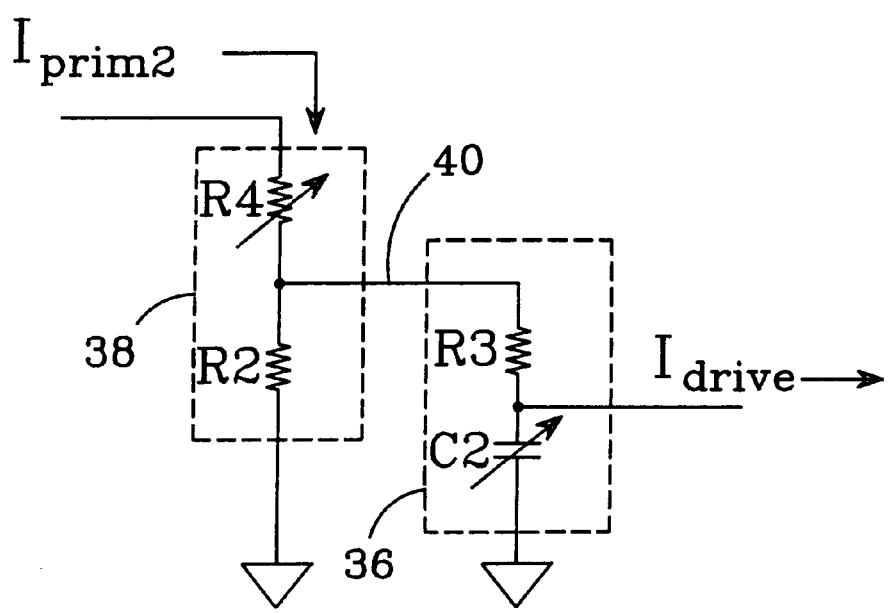
FIG. 5b is a schematic diagram of a variable attenuator circuit and a variable phase shifter circuit usable with a tunable inductor system per the present invention.

When one or both of circuits 36 and 38 are variable, the primary coil's impedance can be tuned at any time; an example implementation of phase shifter 36 and attenuator 38 circuits that are variable is shown in FIG. 5b. Variable attenuation is provided by making a voltage divider resistor R4 variable, and variable phase shift is attained by replacing fixed capacitor C1 with variable capacitor C2, which can be implemented with a varactor, for example. This configuration produces an output $I_{drive}$ whose phase and amplitude relationships to $I_{prim2}$ can be varied, to in turn vary the primary coil's impedance.

The phase shifter and attenuator circuits are not limited to any particular design, with those shown in FIGS. 5a and 5b merely illustrative. They are preferably implemented with passive devices, however, to avoid noise that might be induced into the primary coil if active devices were used. It is also preferable that these circuits be integrated with the tunable inductor they are driving if possible, to simplify circuit fabrication and increase reliability. The signal through the primary coil, i.e., $I_{prim}$ (or $I_{prim1}$ in FIG. 4), is not degraded by the inductance components induced by the drive coil, as long as the respective currents have the same frequency, which is insured if the drive current is derived from the primary current, and the phase shifter bandwidth is wide enough to accommodate the range of expected signal frequencies.

The implementation of the phase shifter and attenuator circuits is an important design consideration. In order to achieve a high-Q, it is desirable to keep the series resistance of the primary current's signal path as low as practically possible. Using a directional coupler 34, as shown in FIG. 4, attenuates $I_{prim}$ only slightly, and it is this configuration that produces the extremely high-Q performance discussed below. Present directional couplers are not, however, integrable, and therefore this configuration does not offer a totally integrated inductor.

The circuits of FIGS. 5a and 5b could be driven by $I_{prim}$ directly, without using a coupler. This configuration provides a fully functional integrated tunable inductor, because both the coils and the phase shifter and attenuation circuits can be integrated on a common substrate (discussed in more detail below). However, the presence of these circuits is likely to load the $I_{prim}$ signal path somewhat, reducing the Q which can be attained.

Figure 5C:
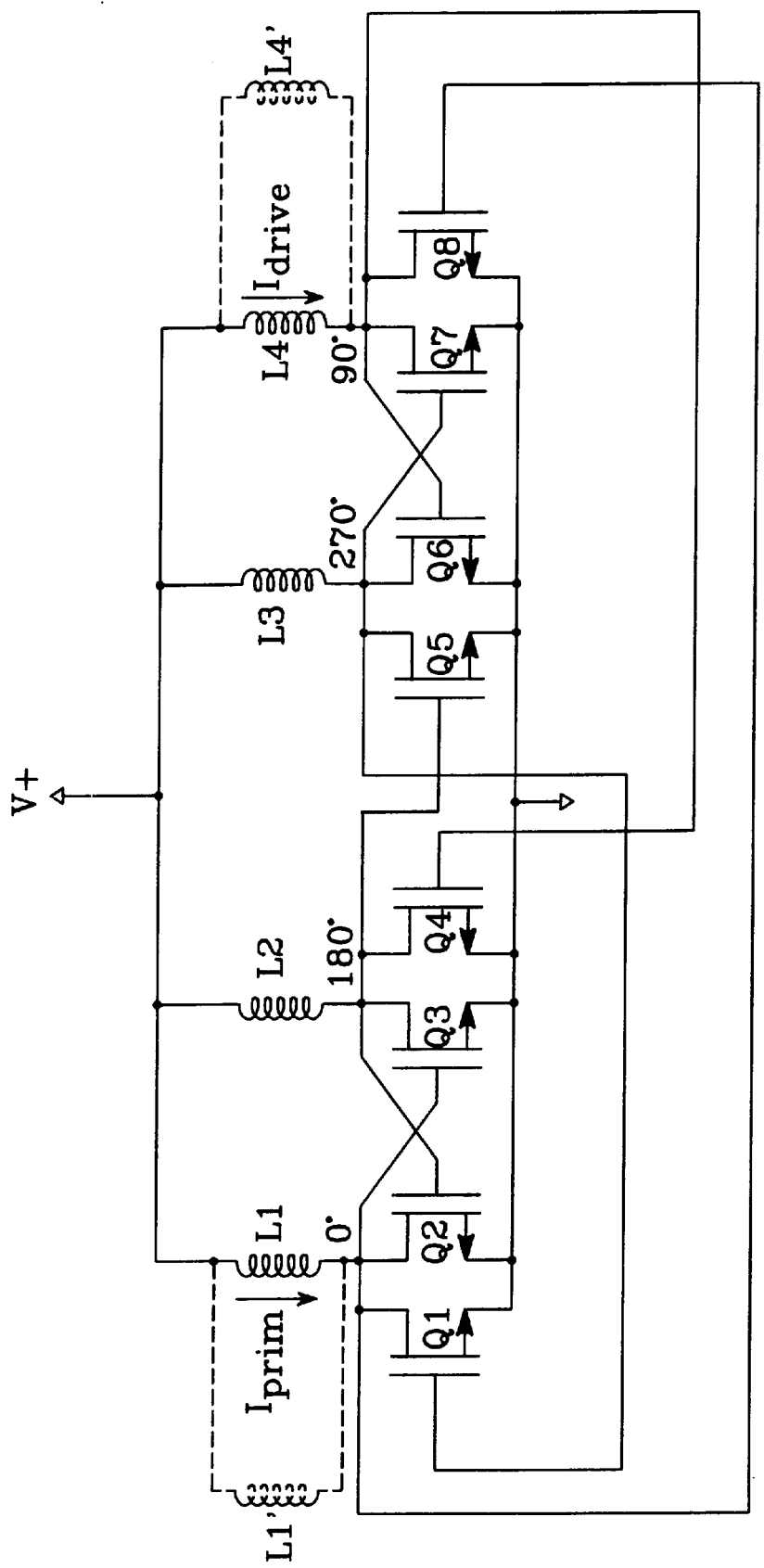
FIG. 5c is a schematic diagram of an integrable phase generator circuit usable with a tunable inductor system per the present invention.

An example of a phase generator circuit which is integrable with the coils, but which has a very small loading affect on $I_{prim}$ is shown in FIG. 5c. Eight transistors Q1–Q8 and four coils L1–L4 are interconnected to form a polyphase oscillator. Outputs are taken from one side of each of coils L1–L4. All four outputs have the same frequency, but the outputs from L2, L3 and L4 are phase-shifted from that from L1 by 180°, 270°, and 90°, respectively. Any one of coils L1–L4 can then serve as the primary coil, and one of the remaining coils as the drive coil, with the phase angle between the primary current $I_{prim}$ and drive current $I_{drive}$ determined by which inductors are chosen. For example, L1 can be used as primary coil and L4 as drive coil, as long as L1 and L4 are fabricated in close proximity to each other such that $I_{drive}$ induces mutual inductance components in L1. Drive current $I_{drive}$ will be phase shifted from primary current $I_{prim}$ by 90°, without introducing series resistance into $I_{prim}$. Alternatively, a parallel primary coil L1' and drive coil L4' could be connected in parallel across selected coils of the oscillator to further reduce the degradation of the primary current due to the phase shifting circuitry.

Figure 6:
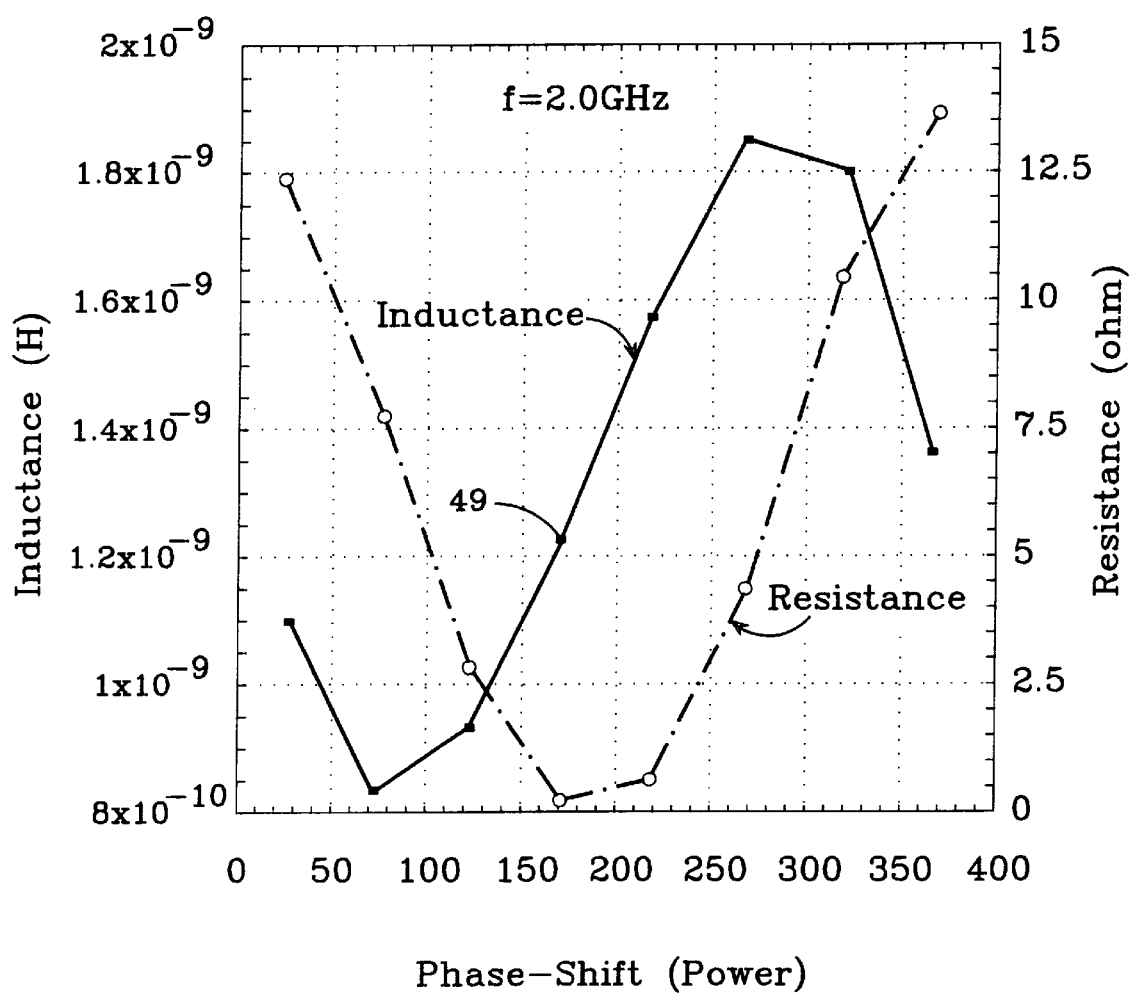
FIG. 6 is a graph of a tunable inductor's inductance and resistance with respect to phase shift.

A graph of inductance and resistance as a function of relative phase is shown in FIG. 6, which was achieved with a tunable inductor built per the present invention, with phase shifter and attenuation circuits per FIG. 4 (using a directional coupler). The x-axis is in units of degrees of phase shift between the power delivered to the primary coil with respect to that delivered to the drive coil, at a frequency of 2 GHz. Note that the phase angle between the power waveforms differs from that between the currents, due to the complex nature of the reactance measured. The primary coil's inductance is seen to vary from about $8.5 \times 10^{-10}$ H to about $1.85 \times 10^{-9}$ H—a range of just over 2:1. Similarly, the primary coil's resistance varies from a low of about 0.2 Ω and about 13.4 ohms—a range of about 67:1. Note that the resistance is at or below about 2.6 Ω throughout the range where the inductance curve is its steepest, between about 120 and about 250 degrees of phase shift for this inductor, so that high-Q values are attainable at any point on this part of the inductance curve. A point 49 about midway along the steepest part of the inductance curve represents the inductance of the primary coil alone; thus, the inductance of the primary coil alone defines the approximate midpoint of the tunable inductor's tuning range.

As noted above, the phase shift needed to attain particular values of inductance or resistance are strongly dependent on the coil geometries. The graph of FIG. 6 thus illustrates the performance achievable with one particular inductor configuration, which comprised two coils arranged as shown in FIG. 2a, each of two turns, with each trace about 15 μm wide and between 1 and 2 μm thick.

Figure 7:
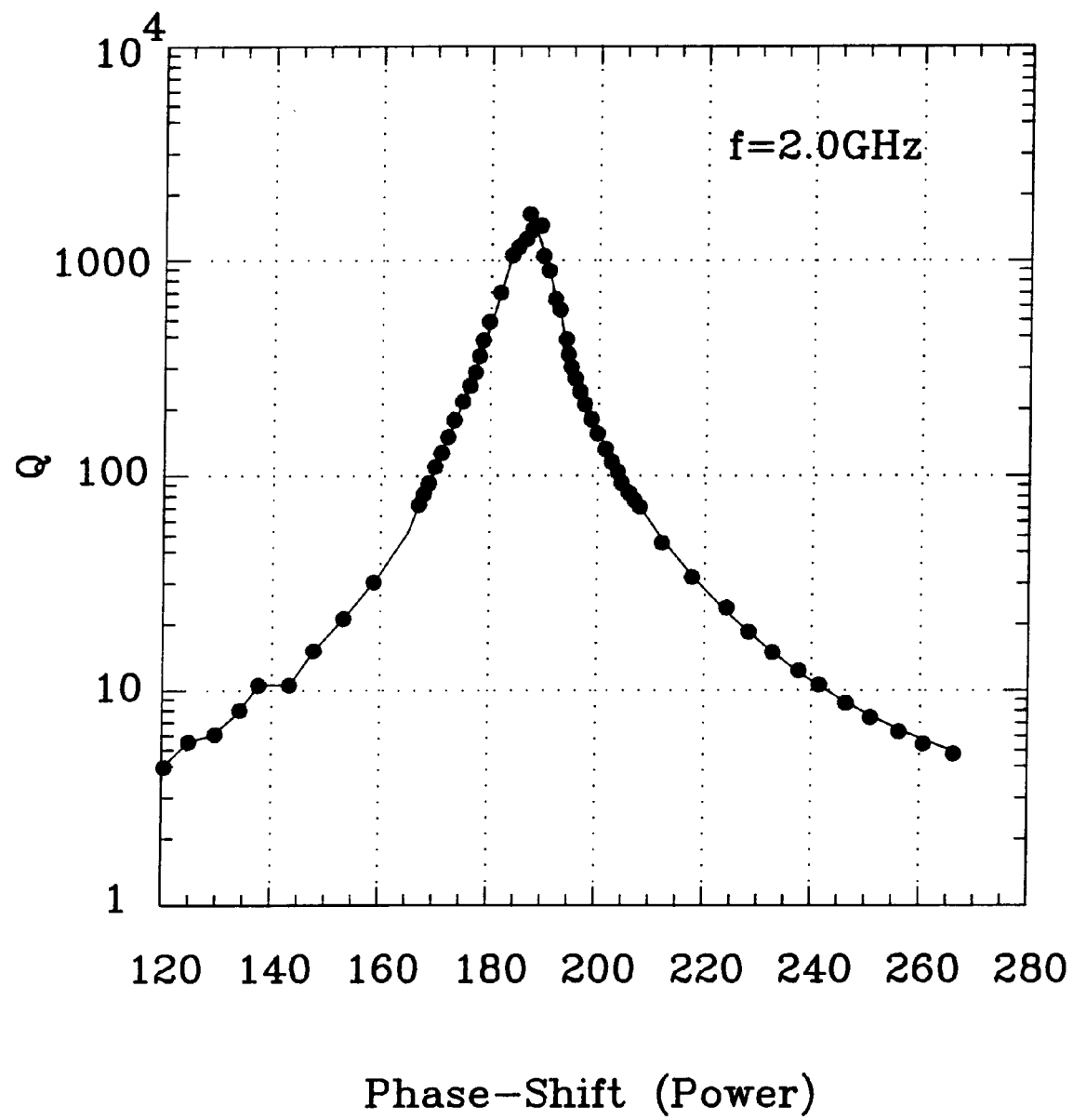
FIG. 7 is a graph of a tunable inductor's quality factor with respect to phase shift.

A graph of the Q of the inductor in FIG. 6 as a function of relative phase is shown in FIG. 7. This graph illustrates that when the phase relationship between the currents is adjusted to attain a minimum value of resistance, here at about 187 degrees of phase shift, a Q value of nearly 2000 is achieved at a frequency of 2 GHz. This significant compensation of resistive losses in the primary coil enables an unprecedented level of frequency selectivity in an integrated inductor.

Figure 8:
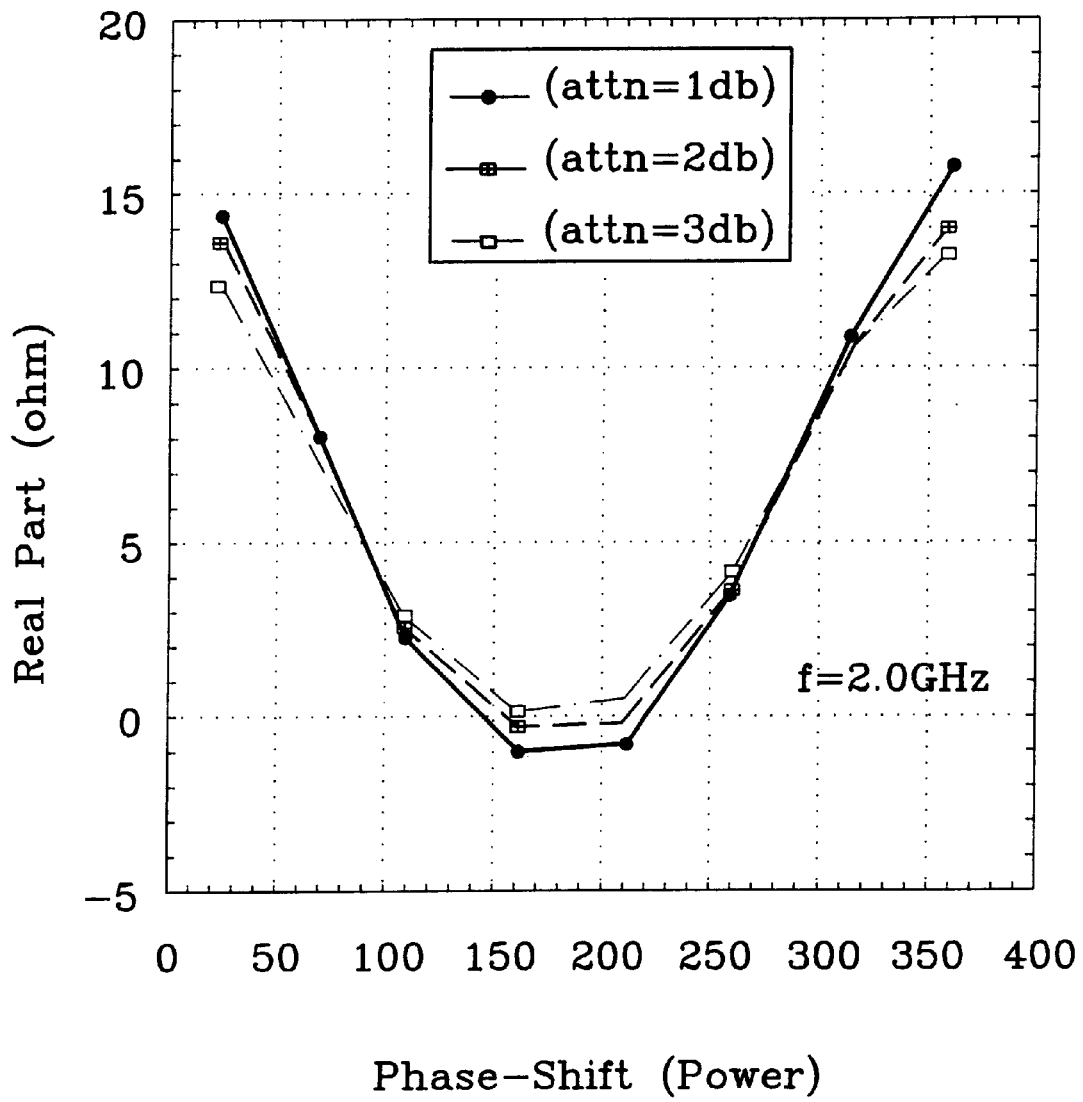
FIG. 8 is a graph of a tunable inductor's resistance with respect to phase shift under several attenuation conditions.

Even higher values of Q can be achieved with the inductor structure disclosed herein by lowering the primary coil's resistance even further. From Eq. 6, it is seen that one way this can be accomplished is by increasing the amplitude of the drive current with respect to the primary current, i.e., increasing "A". FIG. 8 is a graph of the real part of the primary coil's impedance, i.e., its resistance, as a function of relative phase, with curves shown for drive currents attenuated from the primary current by 1, 2 and 3 db. As can be seen on the graph, a negative real part exists at the primary coil for drive current amplitudes attenuated by only 1–2 db, and the invention thus enables zero resistance and the achievement of infinite Q values. However, a negative resistance may produce an undesirable state of conditional instability, and thus operating the inductor with a positive primary coil resistance of at least 0.1 Ω is recommended.

The tunable inductor structure described herein can also be used to create a capacitance. From Eq. 4 above, it was seen that $Z_{prim}$ varies with the value of M, which can be positive or negative. If M is made negative enough to make the net reactive impedance seen at the terminals of the primary coil negative, the result is a capacitive looking impedance.

Figure 9:
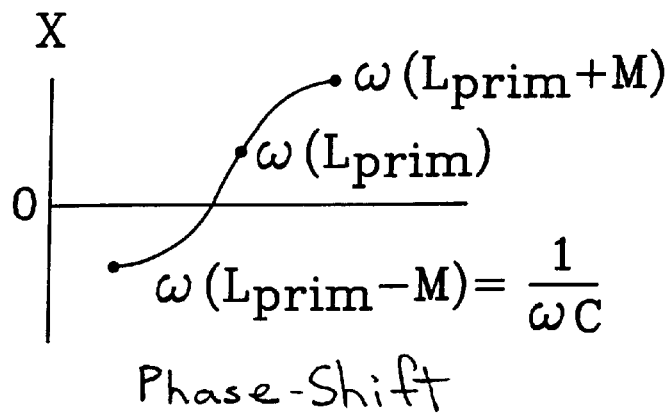
FIG. 9 is a graph of a tunable inductor's reactance with respect to phase shift with a mutual inductance component larger than the primary coil's inductance value.

A graph illustrating this is shown in FIG. 9, which plots the reactance X seen at the terminals of a tunable inductor's primary coil having an inductance $L_{prim}$ as a function of relative phase. The maximum positive reactance occurs at M's maximum positive value, and is equal to $\omega(L_{prim}+M)$. When M cos φ is equal to zero, the reactance is equal to $\omega L_{prim}$. A sufficiently large negative M cos φ value pulls the reactance negative, with the maximum negative reactance equal to $\omega(L_{prim}-M)$ and thus to $-1/\omega C$: an impedance value that looks capacitive. Thus, by making M sufficiently large, by increasing the amplitude of $I_{drive}$ for example, integrated capacitors with very large values of capacitance can be created.

A useful inductor or capacitor per the present invention only requires that primary and drive coils having respective currents flowing in them be close enough to each other so that the drive current induces mutual components of inductance in the primary coil. The coils can be off-chip or integrated, with benefits accruing in either case due to the invention's high-Q and tunability characteristics.

However, the greatest benefits over the existing art are found when the tunable inductor is integrated, because of the low-Q, lack of precision, and self-resonant frequency problems inherent in existing integrated inductors. The inductor can be integrated using any fabrication process which produces metal layers, but is particularly beneficial when made with standard CMOS processes. This is because parasitic capacitance tends to be fairly high with a silicon substrate, and is reduced when using the smaller primary coil made possible by the invention. Also, the thin-film processes common to standard CMOS fabrication techniques tends to cause relatively high series resistance values, which the invention can compensate for as described above. Other processes, such as those used with a gallium arsenide (GaAs) substrate, can also be used, but possibly to lesser advantage. GaAs processes, for example, typically provide thicker metal layers, lowering resistance and increasing Q, and have lower parasitic capacitances.

Figure 2C:
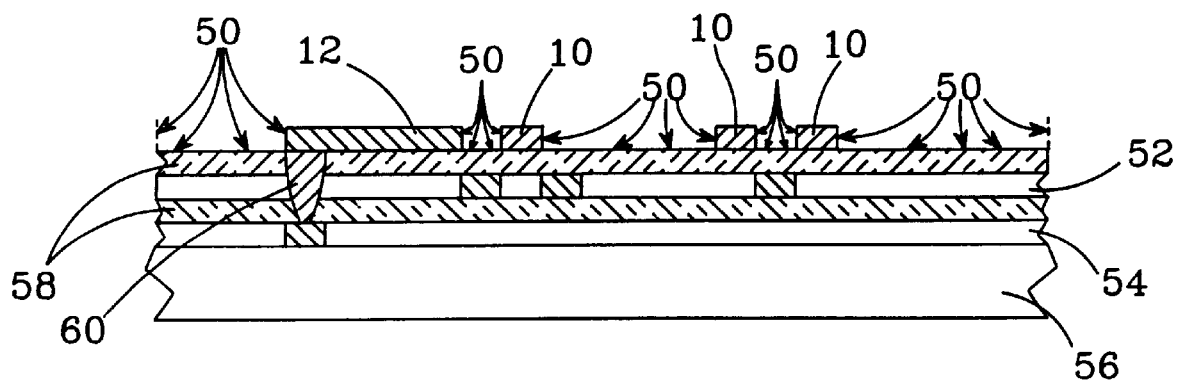

One possible integrated inductor structure is shown in FIGS. 2a and 2c, which uses a standard 3-metal 0.5 μm CMOS process. As seen most clearly in the cross-section of FIG. 2c, the primary coil is fabricated on the top, "metal 3" layer 50, and the drive coil fabricated on the middle, "metal 2" layer 52. Also present are a "metal 1" layer 54, silicon substrate 56, and intervening layers 58 which are typically silicon dioxide ($SiO_2$). Vias 60 can be used to connect the coils to other circuitry, with interconnecting traces in the metal 1 layer, for example. The metal 3 layer is preferred for the primary coil because is furthest from the substrate, thus offering the lowest parasitic capacitance, and because metal 3 provides the thickest metal features, and thus the lowest series resistance.

The structure shown in FIGS. 2a and 2c is merely illustrative, with many other implementations possible. Other design considerations may dictate a different arrangement of coils: for example, in some instances it may be preferable to place the drive coil in the top metal layer. Because the drive coil's parasitic capacitance can lead to a self-resonance condition which could cause it to drive the primary coil less efficiently, placing the drive coil in the top layer so as to best reduce its inherent capacitance may be preferable. Another alternative would place both coils in the metal 3 layer, though in this case care must be taken to insure that the coils are electrically isolated from each other. Other geometries of interest might vary the number of turns between the primary and drive coils, as well as their width, to trade off inductance and resistance values.

Figure 10A:
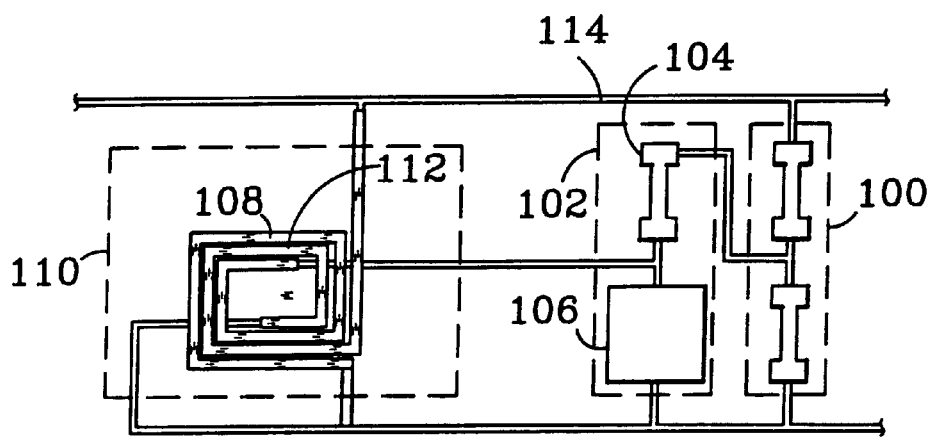
FIG. 10a is a top plan view of a tunable inductor, and attenuator, and a phase shifter integrated together on a common substrate.
Figure 10B:
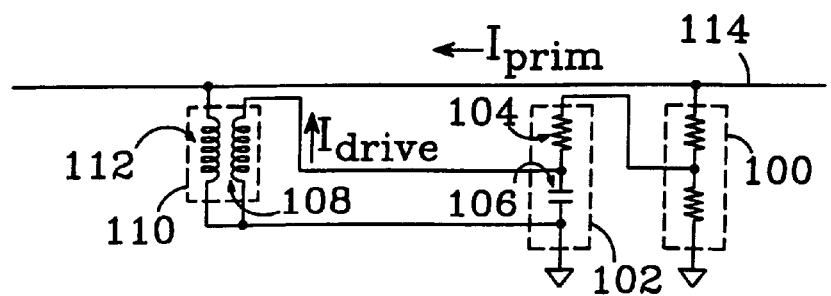

In general, higher levels of electronic circuit integration are preferred over lower levels. Because the present inductors are integrable, they may be integrated on a common substrate with the phase shifter and attenuator circuits, as well as other circuit elements, to achieve a high level of integration. An illustrative example of this is shown in the plan view of an integrated tunable inductor, phase shifter and attenuator in FIG. 10a, with a schematic diagram for these components shown in FIG. 10b. An attenuator 100 consists of two integrated resistors configured as a voltage divider. The output of the attenuator is connected to a phase shifter 102 made from an integrated resistor 104 and an integrated capacitor 106 connected in series. The output of the phase shifter is a drive current $I_{drive}$, which is connected to the drive coil 108 of a tunable inductor 110 that has a primary coil 112 in close proximity to the drive coil. A primary current $I_{prim}$ is connected to the input of the attenuator and to the primary coil via an interconnection trace 114. Two of the many possible variations for the circuit of FIG. 10 include making capacitor 106 variable in order to provide a way to tune inductor 110, and eliminating attenuator 100— assuming phase shifter 102 provides an appropriate degree of attenuation.

The integrable tunable inductor described herein is useful in a myriad of analog circuits, such as in LNAs for which low resistance is critical to input matching, in power amplifier output matching circuits for which losses decrease power efficiency, and in the load impedances of mixers and amplifiers for which extremely high-Q components allow high-performance operation with a low current drive, facilitating extremely low power consumption. The tunable inductors also provide extremely low phase noise in the tank circuits of VCOs, enabling such circuits to be fully integrated for the first time. In filtering applications, whereas previous conventional technologies typically relied on surface acoustic wave (SAW) or other high-Q acoustic resonator technology, the integrable tunable inductors make possible lumped-element filter design using extremely high-performance inductors and capacitors.

Figure 11:
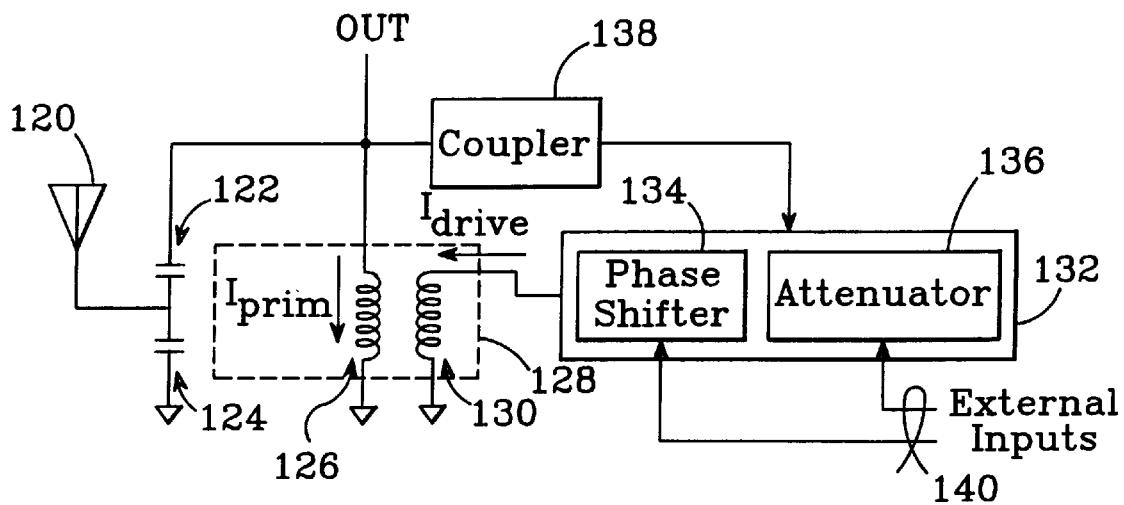
FIG. 11 is a schematic diagram of an application of a tunable inductor in a pre-selector circuit.

One typical application is shown in FIG. 11, which is a schematic diagram of a transceiver's pre-selector circuit, using a tunable inductor as a component. Signals are received with an antenna 120 which is connected to the junction between two series-connected capacitors 122 and 124. The terminal of capacitor 122 opposite the junction is connected to a primary coil 126 of a tunable inductor 128, so that signals derived from the antenna cause a current $I_{prim}$ to flow in the primary coil. The inductor 128 also includes a drive coil 130, which is driven with a drive current $I_{drive}$ supplied by a drive source circuit 132. The drive source circuit preferably includes variable phase shifter 134 and variable attenuator 136 subcircuits, and receives a signal equivalent to $I_{prim}$ via a directional coupler 138. The inductance and resistance of the primary coil 126 are set by external input signals 140 connected to control the tuning of the phase shifter and attenuator circuits. These circuits are tuned as needed to cause incoming signals that fall within a desired frequency range to be passed to the pre-selector's output OUT.

Simply connecting the phase shifter circuit 134 directly to the OUT terminal, eliminating the coupler, also provides a functional pre-selector, though the inductor's Q performance may be sacrificed. However, eliminating the coupler permits all of the pre-selector circuitry to be integrated together on a common substrate. Attenuator circuit 136 should also be considered optional, because the needed degree of attenuation can be probably be designed into phase shifter 134.

Figure 12:
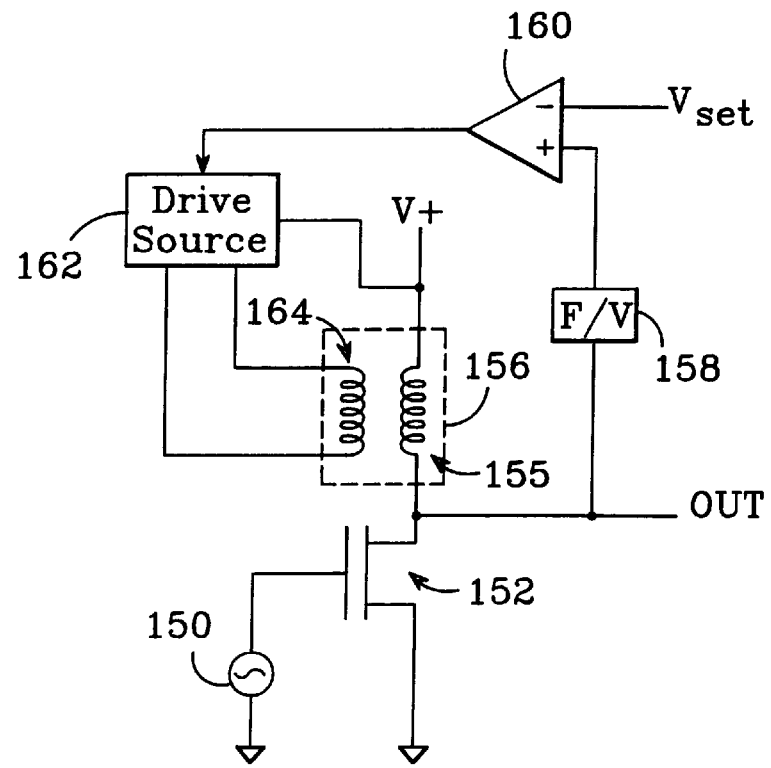
FIG. 12 is a schematic diagram of an application of a tunable inductor in a tunable inductive load circuit.

Because the inductance and resistance of the tunable inductor can be varied, it will often be employed as an element of a closed-loop circuit. An example of this is shown in the schematic diagram of FIG. 12, which depicts using a tunable inductor to provide a tunable inductive load to an amplifier. A signal to be amplified 150 is connected to the gate of a FET 152. The FET's drain is connected to a primary coil 155 of a tunable inductor 156 connected to a positive supply voltage, with the primary coil serving as an inductive load for the transistor. A frequency-to-voltage (F/V) converter circuit 158 connected to the FET's drain converts the frequency of the amplifier's output to a voltage, which is compared to a reference voltage $V_{set}$ with an error amplifier 160. The amplifier's error voltage output is fed to a drive source circuit 162 which also receives a signal representing the current through primary coil 155. The drive source circuit generates a drive current to the drive coil 164 of the tunable inductor 156 needed to drive the error voltage output to zero. In this way, the inductive load is tuned to a particular frequency by simply adjusting the value of $V_{set}$.

While particular embodiments of the invention have been shown and described, numerous variations and alternate embodiments will occur to those skilled in the art. Accordingly, it is intended that the invention be limited only in terms of the appended claims.

We claim:

1. A method of establishing a desired capacitance for a conductive coil, comprising the steps of:

driving a primary coil with an alternating primary current, driving a drive coil with an alternating drive current $I_{drive}$, said primary coil and said drive coil driven with their respective currents simultaneously, said drive coil in proximity to said primary coil such that said drive current induces mutual inductance components M in said primary coil, and establishing phase and amplitude relationships between said drive current and said primary current to make said mutual inductance components M sufficiently negative to obtain a negative reactance value X for said primary coil such that the impedance for said primary coil appears capacitive.

2. The method of claim 1, wherein said step of establishing phase and amplitude relationships between said drive current and said primary current to make said mutual inductance components M sufficiently negative to obtain a negative reactance value X for said primary coil is accomplished by increasing the amplitude of said drive current $I_{drive}$ until said reactance value X is pulled negative.

3. The method of claim 1, wherein said step of establishing phase and amplitude relationships between said drive current and said primary current to make said mutual inductance components M sufficiently negative to obtain a negative reactance value X for said primary coil is accomplished by making the current driving said drive coil and the current driving said primary coil flow in opposite directions.

4. A tunable capacitor system, comprising:

a conductive primary coil, a primary current source connected to supply an alternating primary current through said primary coil, a conductive drive coil, and a drive current source connected to supply an alternating drive current to said drive coil which has a particular phase and amplitude relationship to said primary current, both of said primary and said drive currents supplied simultaneously, said drive coil in proximity to said primary coil such that said drive current induces mutual inductance components M in said primary coil, said drive current source arranged to set the phase and amplitude relationships between said drive current and said primary current to establish an M value which is negative and has an amplitude sufficient to produce a negative reactance value X in said primary coil such that the impedance of said primary coil appears capacitive.

5. The tunable capacitor of claim 4, wherein the respective frequencies of said primary and drive currents are equal, and the phase and amplitude relationships between said drive current and said primary current are fixed to establish a fixed capacitance for said primary coil.

6. The tunable capacitor system of claim 4, wherein said drive current source comprises a phase shifter circuit which receives a signal representing said primary current at an input and supplies said drive current at an output, said phase shifter circuit arranged to establish a desired phase relationship between said primary current and said drive current.

7. The tunable capacitor system of claim 6, wherein said phase shifter circuit is arranged to vary the phase relationship between said drive current and said primary current in response to an external input.

8. The tunable capacitor system of claim 6, wherein said drive current source further comprises an attenuator circuit connected to provide said drive current to said drive coil with a particular amplitude relationship to said primary current, said attenuator circuit arranged to establish a negative reactance value for said primary coil.

9. The tunable capacitor system of claim 8, wherein said attenuator circuit is arranged to vary the amplitude relationship between said drive current and said primary current in response to an external input.

10. The tunable capacitor system of claim 6, further comprising a directional coupler connected to receive said primary current at an input and to produce said signal representing said primary current at an output.

11. The tunable capacitor system of claim 4, wherein said primary current source is arranged to supply said primary current to said primary coil in a first direction and said drive current source is arranged to supply said drive current to said drive coil in a second direction, said second direction being opposite to said first direction.

* * * * *